(12) United States Patent
O'Connell et al.

(10) Patent No.: US 12,575,057 B2
(45) Date of Patent: Mar. 10, 2026

(54) STRUCTURALLY ENHANCED FAN LOUVER ASSEMBLY

(71) Applicant: International Business Machines Corporation, Armonk, NY (US)

(72) Inventors: Kevin O'Connell, Rochester, MN (US); Alex Matos, Rochester, MN (US); Janet Cederholm, Rochester, MN (US); Brenda Berg, Rochester, MN (US); William James Anderl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 935 days.

(21) Appl. No.: 17/644,786

(22) Filed: Dec. 16, 2021

(65) Prior Publication Data

US 2023/0200002 A1 Jun. 22, 2023

(51) Int. Cl.
 *H05K 7/20* (2006.01)
 *F24F 13/10* (2006.01)
(52) U.S. Cl.
 CPC ......... *H05K 7/20181* (2013.01); *F24F 13/10* (2013.01)
(58) Field of Classification Search
 None
 See application file for complete search history.

(56) References Cited

U.S. PATENT DOCUMENTS

| | | | | |
|---|---|---|---|---|
| 6,229,701 | B1 * | 5/2001 | Kung | ...................... G06F 1/203 |
| | | | | 174/16.3 |
| 6,694,759 | B1 | 2/2004 | Bash | |

| | | | | |
|---|---|---|---|---|
| 7,554,803 | B2 * | 6/2009 | Artman | .............. H05K 7/20563 |
| | | | | 361/695 |
| 8,405,983 | B2 * | 3/2013 | Chen | ....................... G06F 1/181 |
| | | | | 361/679.48 |
| 8,978,747 | B2 | 3/2015 | Peterson | |
| 11,191,183 | B1 * | 11/2021 | Lin | ................... H05K 7/20736 |
| 11,388,838 | B2 * | 7/2022 | Yang | ...................... F04D 25/14 |
| 2003/0224717 | A1 * | 12/2003 | Tsai | .................... H05K 7/2019 |
| | | | | 454/184 |
| 2005/0168945 | A1 * | 8/2005 | Coglitore | ........... H05K 7/20736 |
| | | | | 415/178 |

(Continued)

FOREIGN PATENT DOCUMENTS

| | | |
|---|---|---|
| CN | 203734995 U | 7/2014 |
| JP | 2003106068 A | 4/2003 |
| KR | 20140126558 A | 10/2014 |

*Primary Examiner* — Courtney L Smith

(74) *Attorney, Agent, or Firm* — James L. Olsen

(57) ABSTRACT

A server includes a printed circuit board (PCB), an electronic component connected to the PCB, and a chassis connected to the PCB. The chassis includes a first end with a first aperture configured to allow airflow into the server, a second end with a second aperture configured to allow the airflow out of the server after having passed across the electronic component, and a movable bulkhead comprising a first set of louvers, the movable bulkhead being movable between a closed position and an opened position, wherein each of the louvers includes a leading edge contact feature configured to interface with a trailing edge of a respective adjacent louver. In the closed position, the first set of louvers forms a wall in a primary path of the airflow, and, in the opened position, the first set of louvers are oriented in a direction of the primary path of the airflow.

18 Claims, 5 Drawing Sheets

(56)          References Cited

U.S. PATENT DOCUMENTS

| | | | | |
|---|---|---|---|---|
| 2008/0151490 A1* | 6/2008 | Fan | G06F 1/20 | |
| | | | 361/690 | |
| 2009/0213544 A1* | 8/2009 | Dittus | H05K 7/20727 | |
| | | | 361/695 | |
| 2012/0168145 A1* | 7/2012 | Peterson | H05K 7/20836 | |
| | | | 165/104.11 | |
| 2014/0211419 A1* | 7/2014 | Liao | H05K 7/20181 | |
| | | | 361/695 | |
| 2015/0010391 A1* | 1/2015 | Ma | F04D 25/0613 | |
| | | | 415/151 | |
| 2016/0116184 A1* | 4/2016 | Chappell | F24F 13/1406 | |
| | | | 454/335 | |
| 2016/0128226 A1* | 5/2016 | Stellick | H05K 7/20727 | |
| | | | 361/679.46 | |
| 2018/0098463 A1 | 4/2018 | Campbell | | |
| 2019/0335616 A1* | 10/2019 | Anderl | H05K 7/20727 | |
| 2020/0325905 A1 | 10/2020 | Smailes | | |

* cited by examiner

STRUCTURALLY ENHANCED FAN LOUVER ASSEMBLY

BACKGROUND

The present disclosure relates to computer servers, and more specifically, to bulkhead structures for computer servers.

Within a datacenter, there can be many server racks that each include several computer servers. In traditional systems, the servers are supported on two opposite sides, which leaves the centers of the servers unsupported by the server rack. During transportation and installation of a server rack, the assembly is at risk of being dropped. This would subject the servers to a temporary but relatively high downward force. This can cause the servers to bend in the middle, which can damage the servers.

SUMMARY

According to an embodiment of the present disclosure, a server includes a printed circuit board (PCB), an electronic component connected to the PCB, and a chassis connected to the PCB. The chassis includes a first end with a first aperture configured to allow airflow into the server, a second end with a second aperture configured to allow the airflow out of the server after having passed across the electronic component, and a movable bulkhead comprising a first set of louvers, the movable bulkhead being movable between a closed position and an opened position, wherein each of the louvers includes a leading edge contact feature configured to interface with a trailing edge of a respective adjacent louver. In the closed position, the first set of louvers forms a wall in a primary path of the airflow, and, in the opened position, the first set of louvers are oriented in a direction of the primary path of the airflow.

According to an embodiment of the present disclosure, a server rack includes a base, a plurality of rails extending from the base, and a server connected to the rails. The server includes a PCB, an electronic component connected to the printed circuit board, and a chassis connected to the PCB. The chassis includes a movable bulkhead including a first set of louvers, the movable bulkhead being movable between a closed position and an opened position, wherein each of the louvers includes a leading edge contact feature and a trailing edge contact feature that is configured to interface with the leading edge contact feature of a respective adjacent louver. In the closed position, the first set of louvers forms a wall in a primary path of the airflow, and, in the opened position, the first set of louvers are oriented in a direction of the primary path of the airflow.

DETAILED DESCRIPTION

Figure 1:
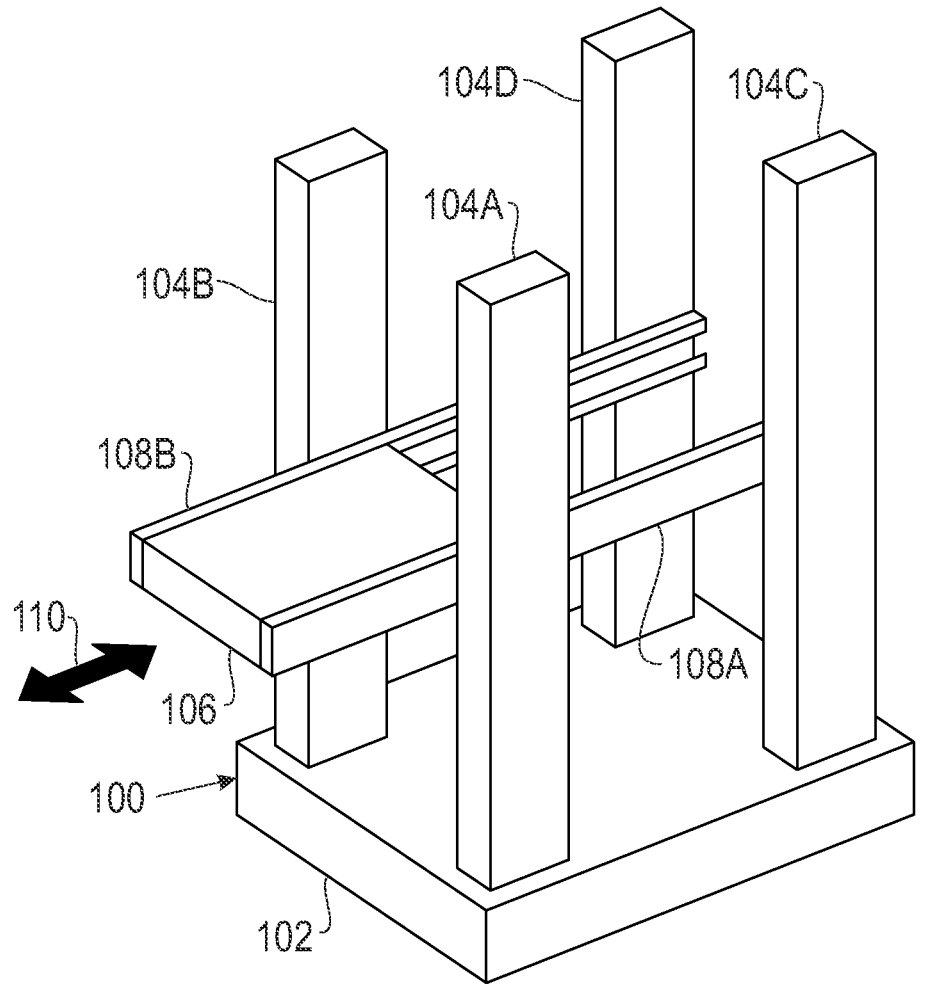
FIG. 1 is a perspective view of a server rack, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary components at the interface of the two elements.

FIG. 1 is a perspective view of server rack 100. In the illustrated embodiment, server rack 100 comprises base 102 and rails 104A-104D (collectively, "rails 104") extending upwards therefrom. Rails 104A-104D are parallel to one another and support a stack of servers 106 (although only one server 106 is shown in FIG. 1). More specifically, server rack 100 includes slider 108A that is mounted to rails 104A and 104C and slider 108B that is mounted to rails 104B and 104D (collectively, "sliders 108"). Sliders 108 are connected to server 106 on opposing sides. Sliders 108 can extend (as is shown in FIG. 1) and retract along direction 110, although during normal installation and operation, sliders 108 are retracted such that server 106 is predominantly positioned within the perimeter of rails 104.

Figure 2:
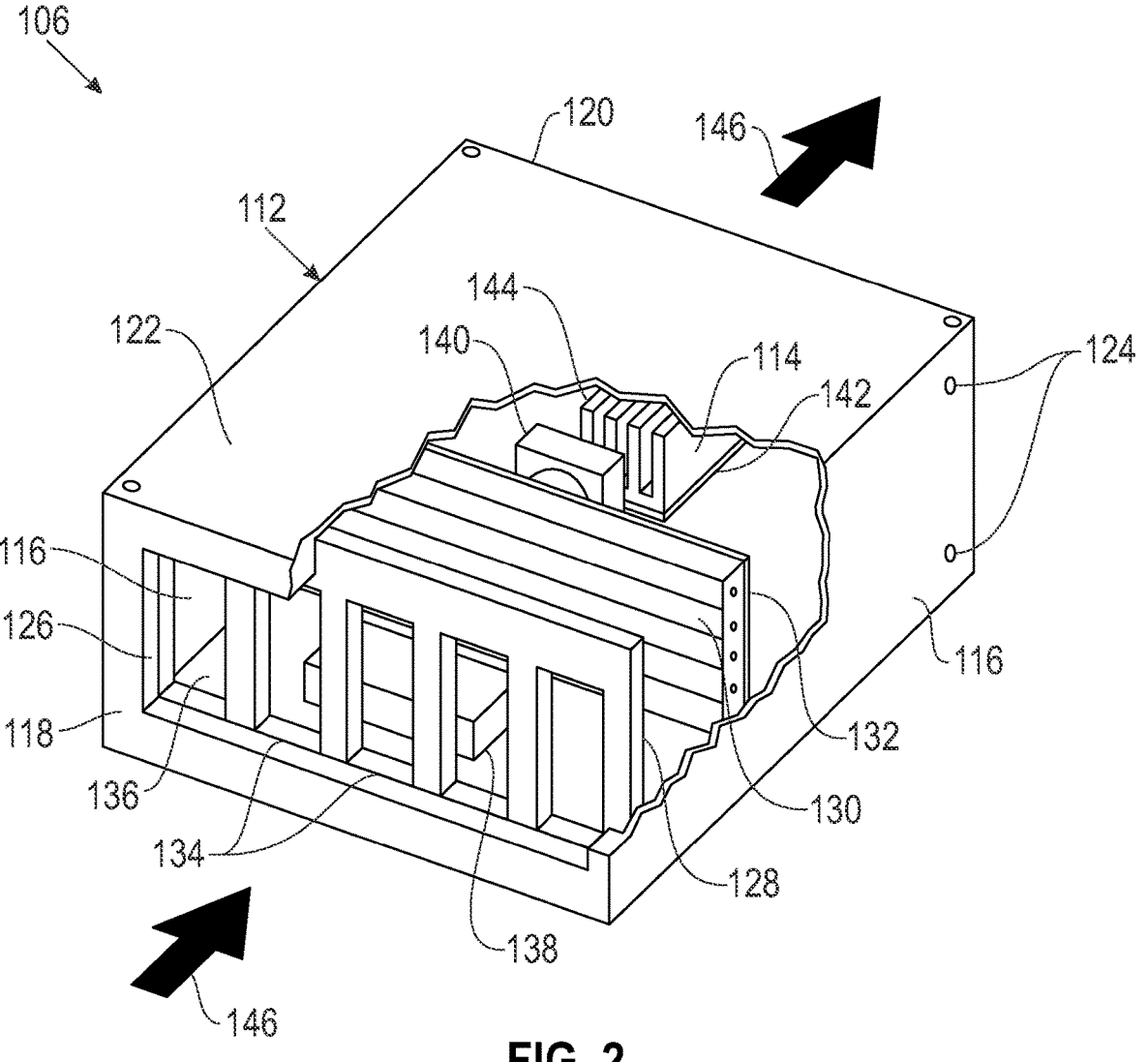
FIG. 2 is a perspective, cut-away view of a server, in accordance with an embodiment of the present disclosure.

FIG. 2 is a perspective, cut-away view of server 106. In the illustrated embodiment, server 106 comprises chassis 112 and electronics 114. Chassis 112 comprises five walls that are fastened together, specifically sides 116, front 118, rear 120, and cover 122. Sides 116 each include a plurality of mounting features 124 (e.g., threaded holes) to connect with rails 104 (shown in FIG. 1). Front 118 includes aperture 126 and rear 120 also includes an aperture (although it is not visible in FIG. 1) to allow for cooling airflow through server 106. Chassis 112 further comprises a plurality of stiffening members that extend across server 106, specifically bulkheads 128, 130, and 132. Bulkheads 128-132 are connected to sides 116 and can also be connected to front 118, rear 120, and/or cover 122. While bulkhead 128 includes a plurality of apertures 134 to allow for cooling airflow through server 106 (since bulkhead 128 is stationary), bulkhead 130 is openable to allow for cooling airflow through server 106 (although bulkhead 130 is shown in the closed position in FIG. 2). While they are not visible, bulkhead 132 also includes a plurality of apertures to allow for cooling airflow through server 106 (since bulkhead 128 is stationary), and bulkhead 132 is also connected to bulkhead 130 to create a double-bulkhead.

In the illustrated embodiment, electronics 114 includes printed circuit board (PCB) 136, hard drive 138, fan 140, processor 142, and heat sink 144. Electronic components such as hard drive 138, fan 140, and processor 142 are mounted to and selectively electrically connected via PCB 136, and heat sink 144 is mounted on processor 142. PCB 136 extends along the bottom of chassis 112 and is connected to bulkheads 128 and 130 (when bulkhead 130 is closed) and can also be connected to sides 116, front 118, and/or rear 120. Having PCB 136 connected to bulkheads 128-132 stiffens PCB 136 since there is no separate floor to chassis 112.

More specifically, server 106 is only connected to server rack 100 (shown in FIG. 1) at sides 116, so the center of server 106 is subject to a bending load due to gravity. This load can be greatly increased in the situation where server rack 100 is dropped, for example, during transportation or installation of server rack 100. Such a load would urge PCB 136 to bend with the maximum deflection being along a centerline of PCB 136 that runs front to back. However, bulkheads 128 and 130 structurally support PCB 136 so that PCB 136 maintains its shape, avoiding damage during high-load events. Therefore, during transportation of server rack 100, bulkhead 130 can be closed to increase the stiffness of server 106. After installation of server 106 in server rack 100, bulkhead 130 can be moved to the opened position (shown in FIG. 4). This allows fan 140 to force air through server 106, as indicated by arrows 146, to cool electronics 114.

Figure 3:
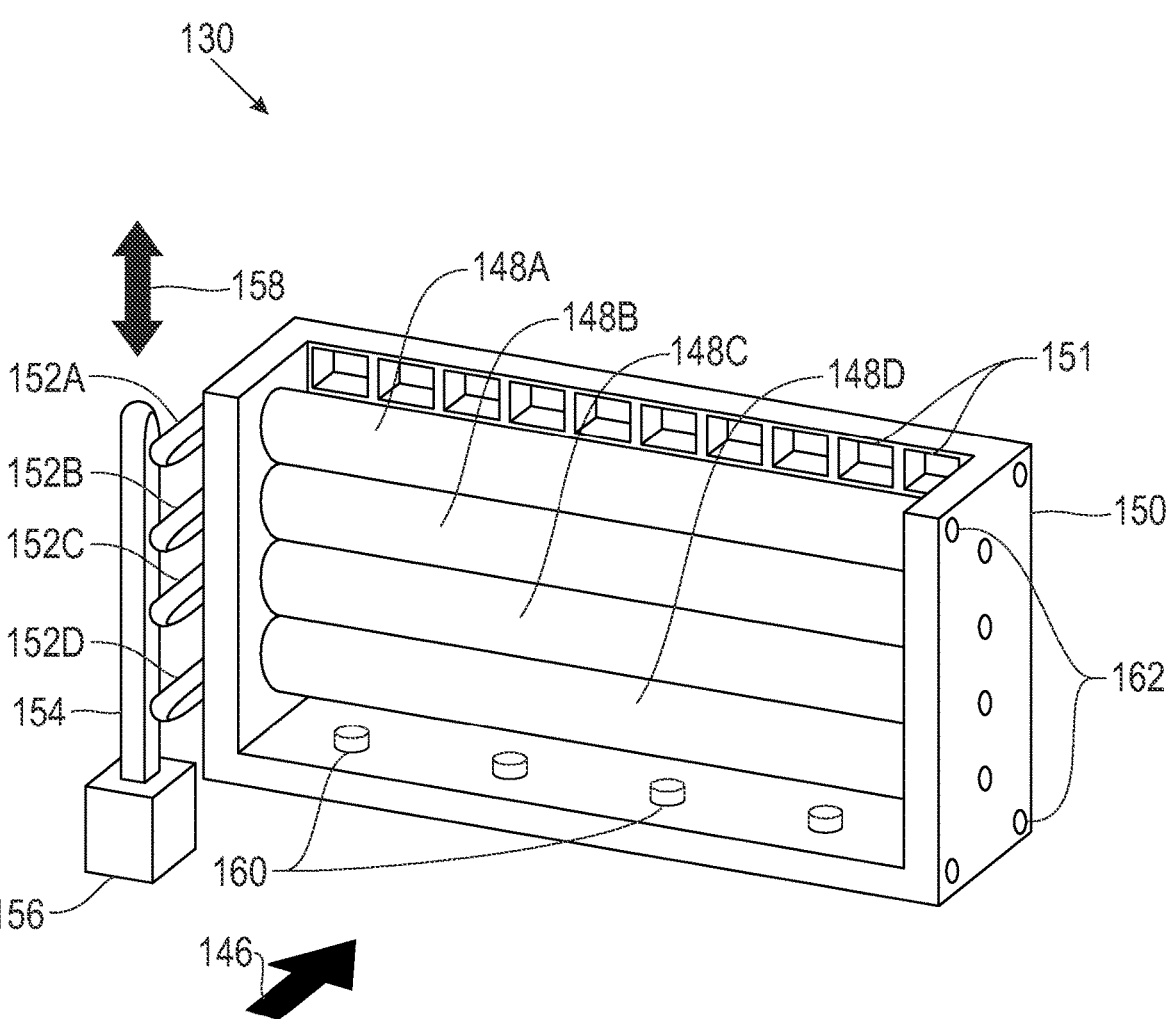
FIG. 3 is a perspective view of a movable bulkhead in a closed position, in accordance with an embodiment of the present disclosure.

FIG. 3 is a perspective view of bulkhead 130 in a closed position. In the illustrated embodiment, bulkhead 130 comprises a plurality of louvers 148A-148D (collectively "louvers 148") that are rotatably connected to frame 150. Each louver 148 is rigidly connected to one of arms 152A-152D (collectively "arms 152"), respectively, through frame 150. Arms 152 are connected to tilt rod 154, and tilt rod 154 is connected to actuator 156. Actuator 156 can be, for example, a solenoid, a linear actuator, and/or a spring (e.g., biased towards the closed position or the opened position).

In the illustrated embodiment, fasteners 160 connect bulkhead 130 to PCB 136 (shown in FIG. 2). Furthermore, bores 162 allow bulkhead 130 to be connected to sides 116 (shown in FIG. 2), provided that bulkhead 130 is sufficiently long to connect to both sides 116. In other embodiments, bores 162 can be used to connect bulkhead 130 to another adjacent movable bulkhead (not shown, but would be alongside bulkhead 130). In addition, while bulkhead 130 can also be connected to the adjacent bulkhead 132 (front to back, as shown in FIG. 2), in some embodiments, bulkhead 132 is absent. While bulkhead 130 can extend up to cover 122 (shown in FIG. 2) and/or be connected thereto, in some embodiments, bulkhead 130 only extends partway to cover 122 from PCB 136. While as depicted respective primary axes (e.g., a length) of louvers 148 are oriented to extend along a direction between PCB 136 and cover 122 (i.e., horizontally), in some embodiments, the primary axes of louvers 148 are oriented to extend along a direction between the two sides 116 (i.e., vertically). These orientations remain true regardless of whether louvers 148 are in the opened or closed positions.

In the illustrated embodiment, louvers 148 are comprised of polymer and/or lightweight metallic materials, such as, for example, glass-filled polycarbonate (PC), acrylonitrile butadiene styrene (ABS), or aluminum. In addition, frame 150 is comprised of polymer or metal, such as, for example, glass-filled PC, ABS, aluminum, steel, or zinc. The majority or the entirety of the back of frame 150 includes a plurality of apertures 151 (although only one row is visible in FIG. 3) to allow for cooling airflow through server 106 (shown in FIG. 2). In some embodiments, apertures 151 are an array of small ports (as shown in FIG. 3), and in other embodiments, apertures 151 are large like apertures 134 (shown in FIG. 2). In yet other embodiments, there is one large aperture 151 in the back of frame 150, or there is not a back to frame 150 at all. In such embodiments, frame 150 can include a top strap (not shown) that extends from the sides of frame 150 over louvers 148. Furthermore, in embodiments that include bulkhead 132, the apertures in bulkhead 132 can correspond to apertures 151.

In the illustrated embodiment, frame 150 structurally supports PCB 136 which can significantly reduce deflection of PCB 136 when under the aforementioned gravity and inertial loads (e.g., from drops). However, frame 150 can also flex under such loads, so when bulkhead 130 is in the closed position, frame 150 (and PCB 136) is supported by louvers 148. This occurs because louvers 148 can contact one another to form a solid wall, so when combined with frame 150, bulkhead 130 is substantially more rigid when in the closed position. This can be especially useful during transportation and installation of server rack 100 (shown in FIG. 1).

Figure 4:
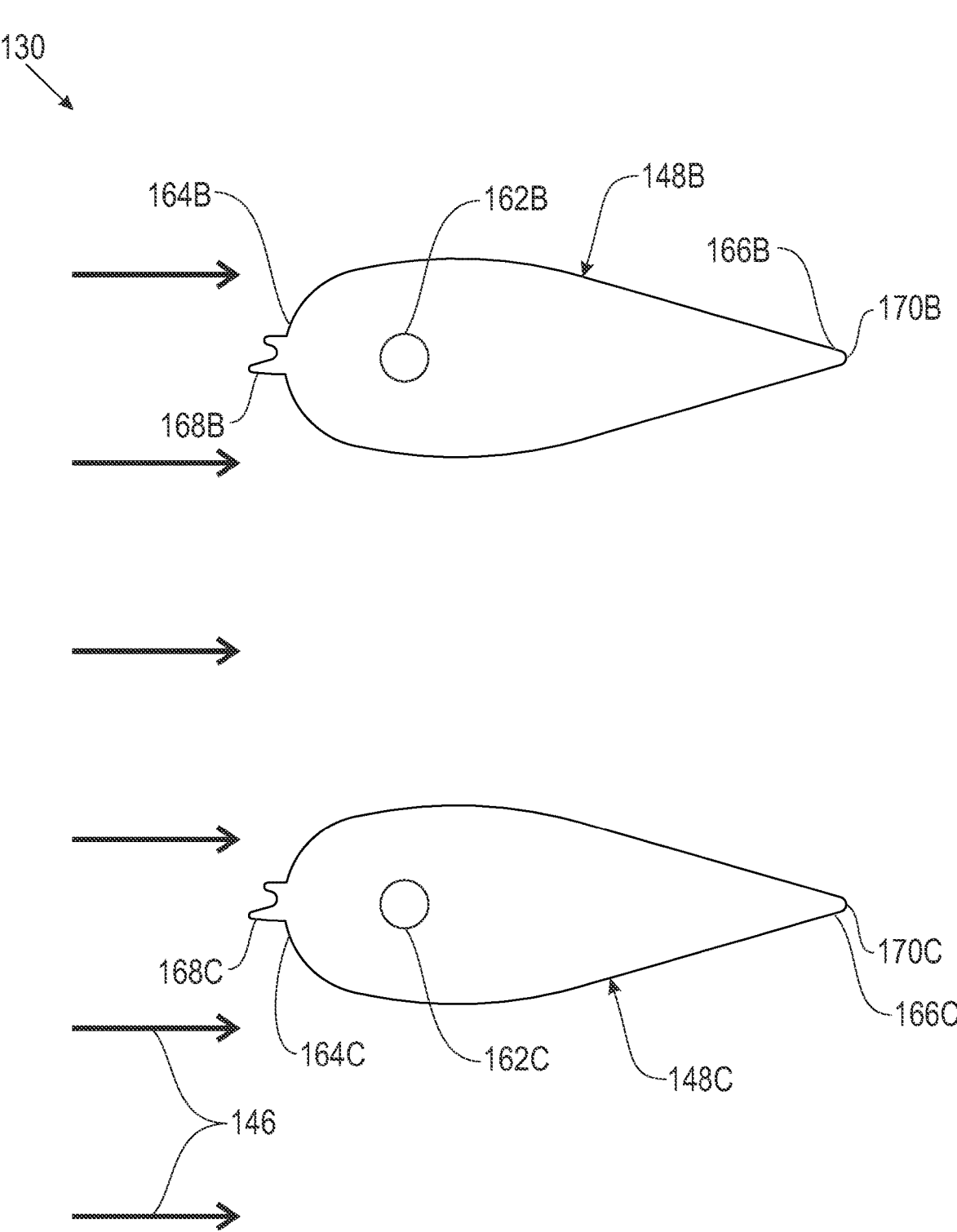
FIG. 4 is a side view of the louvers in an opened position, in accordance with an embodiment of the present disclosure.

However, during operation of server 106, forcing cooling airflow across the electronic components can be desirable. Therefore, actuator 156 can move tilt rod 154 along direction 158. This action rotates louvers 148 (via arms 152) in frame 150. Thereby, bulkhead 130 is moved to the opened position (as shown in FIG. 4) to open the airflow path indicated by arrow 146. However, in some embodiments, actuator 156 is absent, so bulkhead 130 can be moved to the opened position, for example, by a user or by gravity acting on tilt rod 154 (which can be stopped in the opened position by contacting PCB 136). In other embodiments, tilt rod 154 and arms 152 are also absent, so bulkhead 130 can be moved to the opened position, for example, by a user or by airflow acting on louvers 148.

FIG. 4 is a side view of louvers 148B and 148C in an opened position. In the illustrated embodiment, louvers 148 are contoured to be aerodynamic and are oriented parallel to cover 122 and PCB 136 (both shown in FIG. 2) as well as the airflow (indicated by arrow 146). More specifically, when in the opened position, an airfoil-type cord that extends from a leading edge 164 to a trailing edges 166 of a louver 148 is parallel to the path of the primary airflow. Thereby, bulkhead 130 does not substantially impede the primary airflow path through server 106 (shown in FIG. 2) and across the electronic components. In other words, the primary airflow path is open such that the airflow is still sufficient to cool the respective electronic components, even if there is some impedance that occurs through server 106.

In the illustrated embodiment, louvers 148 each include studs 162B and 162C (collectively "studs 162"), leading edges (LEs) 164B and 164C (collectively "LEs 164"), trailing edges (TEs) 166B and 166C (collectively "TEs 166"), LE contact features (LECFs) 168B and 168C (collectively "LECFS 168"), and TE contact features (TECFs) 170B and 170C (collectively "TECFs 170"). Studs 162 interface with frame 150 (shown in FIG. 3) to allow frame 150 to support louvers 148 while still allowing louvers 148 to rotate. LEs 164 are on the upstream ends of louvers 148, and TEs 166 are on the downstream ends of louvers 148. Accordingly, LECFs 168 are located on LEs 164, and TECFs 170 are located on TEs 166. While louvers 148A and 148D (shown in FIG. 3) can be the same as louvers 148B and 148D, in some embodiments, louver 148A lacks an LECF 168 and louver 148D lacks a TECF 170, since there are no louvers 148 adjacent to LE 164A and TE 166D. Furthermore, in some embodiments, frame 150 includes a contact feature (e.g., not shown, but similar to or the same as an LECF 168) to interface with the TECF 170 of louver 148D. Similarly, if there is a top to frame 150, it can include contact feature (e.g., not shown, but similar to or the same as an TECF 170) to interface with the LECF 168 of louver 148A.

Figure 5:
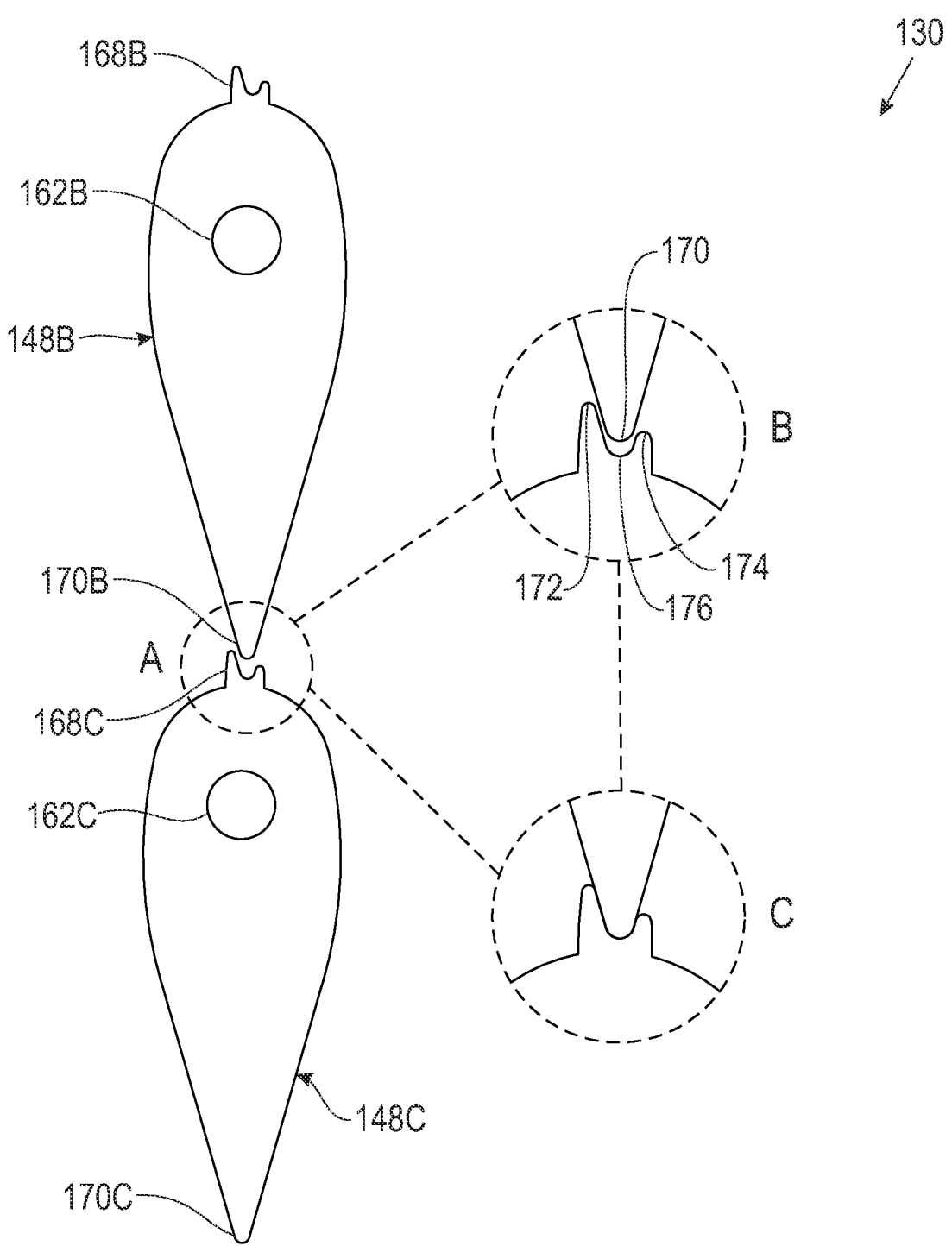
FIG. 5 is a side view of louvers of the movable bulkhead in a closed position, in accordance with an embodiment of the present disclosure.

FIG. 5 is a side view of louvers 148B and 148C in a closed position. In the illustrated embodiment, louvers 148 are oriented perpendicular to cover 122 and PCB 136 (both shown in FIG. 2) as well as the airflow (indicated by arrow 146 in FIG. 4). Generally, LECFs 168 have a concave U-shape, while TECFs 170 have a corresponding convex U-shape such that LECFs 168 and TECFs 170 are configured to interface with a respective adjacent TECF 170 or LECF 168. LECFs 168 are comprised of front peak 172 and rear peak 174 with valley 176 being positioned therebetween. Front peak 172 extends farther from LE 164 than rear peak 174 does. The radii of curvature of LECFs 168 (i.e., valley 176) and TECFs 170 can be the same or are substantially similar with that of LECFs 168 being slightly larger than that of TECFs 170. Since LECFs 168 and TECFs 170 have corresponding U-shapes, LECFs 168 can be guided into TECFs 170 during loading (when bulkhead 130 is closed). Once LECFs 168 and TECFs 170 are interlocked, their relationship is stabilized by the corresponding U-shapes, allowing louvers 148 to resist bending loads without slipping past one another.

FIG. 5 includes three exemplary relationships (i.e., sections A, B, and C) between louvers 148B and 148C. More specifically, section A shows a free fit between TECF 170B and LECF 168C, section B shows a snap fit between TECF 170B and LECF 168C, and section C shows a solid fit between TECF 170B and LECF 168C. In general, the differences between the relationships result from how close TECF 170B is to LECF 168C (i.e., where TECF 170B is positioned with respect to front peak 172, rear peak 174, and valley 176).

In the illustrated embodiment of section A, TECF 170B is positioned inside of front peak 172 but outside of rear peak 174. The free fit shown in section A can occur during a relaxed (i.e., zero-stress) state of bulkhead 130. In the illustrated embodiment of section B, TECF 170B is positioned inside of rear peak 174 but spaced apart from valley 176. The snap fit shown in section B can also occur during a relaxed (i.e., zero-stress) state of bulkhead 130. In the illustrated embodiment of section C, TECF 170B is positioned in direct contact with valley 176. The solid fit shown in section C can occur during a load-bearing (i.e., flexed) state of bulkhead 130.

At rest, louvers 148 can have a free fit or a snap fit, and either the free fit or the snap fit can result in a solid fit when bulkhead 130 is loaded. As indicated previously, the solid fit allows for louvers 148 to form a solid wall that increases the rigidity of bulkhead 130 in order to resist the bending due to the aforementioned gravity and inertial loads (from drops). Thus, bending of PCB 136 (shown in FIG. 2) is also reduced. Because of the load bearing nature of louvers 148, their construction material and the radius of curvature of TECFs 170 should be selected so that TEs 166 are not damaged in a section C relationship.

While a free fit or a snap fit are suitable resting conditions, the components and operation of bulkhead 130 may change depending on which one is chosen. For example, with a free fit, louvers 148 could be opened merely using airflow. Such an arrangement would not require any action by a user or 156 actuator (shown in FIG. 3) to open bulkhead 130. But it would dictate an appropriate center-of-gravity balance with respect to studs 162 so that louvers 148 stay closed during shipping and installation but can open during operation. For another example, with a snap fit, TECFs 170 would need to snap over rear peaks 174 to be moved into the closed position for shipping and installation. But for operation, louvers 148 would not be able to move to the opened position using airflow alone. Instead, a user or actuator 156 would snap louvers 148 open after installation of server rack 100 and/or server 106 (both shown in FIG. 1). After this unsnapping, louvers 148 could be maintained in the opened position, for example, by tilt rod 154 (shown in FIG. 3), actuator 156, or by an appropriate center-of-gravity balance with respect to studs 162. Alternatively, louvers 148 could rest in a mostly closed position and be opened by airflow during operation given an appropriate center-of-gravity balance with respect to studs 162.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A server comprising:
a printed circuit board (PCB);
an electronic component connected to the PCB; and
a chassis connected to the PCB, the chassis comprising:
a first end with a first aperture configured to allow airflow into the server;
a second end with a second aperture configured to allow the airflow out of the server after having passed across the electronic component; and
a movable bulkhead comprising a first set of louvers, the movable bulkhead being movable between a closed position and an opened position, wherein each of the louvers includes a leading edge contact feature having a concave shape configured to interface with a trailing edge contact feature having a corresponding convex shape of a respective adjacent louver;
wherein in the closed position, the first set of louvers forms a wall in a primary path of the airflow; and
wherein in the opened position, the first set of louvers are oriented in a direction of the primary path of the airflow.

2. The server of claim 1, wherein the movable bulkhead further comprises a second set of louvers positioned adjacent to the first set of louvers.

3. The server of claim 1, wherein each of the louvers are oriented to extend along a direction between a first side of the chassis and a second side of the chassis that is opposite to the first side in both the opened position and the closed position.

4. The server of claim 1, wherein each of the louvers are oriented to extend along a direction between the PCB and a cover of the chassis that is over the PCB.

5. The server of claim 1, wherein when the movable bulkhead is in the closed position and at rest, a trailing edge contact feature of each louver is spaced apart from the leading edge contact feature of the respective adjacent louver.

6. The server of claim 5, wherein when the movable bulkhead is in the closed position and is under a bending load, the movable bulkhead can flex such that the trailing edge contact feature of each louver contacts the leading edge contact feature of the respective adjacent louver.

7. The server of claim 1, wherein when the movable bulkhead is in the closed position and at rest, the trailing edge contact feature of each louver contacts the leading edge contact feature of the respective adjacent louver.

8. A server rack comprising:
a base;
a plurality of rails extending from the base; and
a server connected to the rails, wherein the server comprises:
    a printed circuit board (PCB);
    an electronic component connected to the printed circuit board; and
    a chassis connected to the PCB, wherein the chassis includes a movable bulkhead comprising a first set of louvers, the movable bulkhead being movable between a closed position and an opened position, wherein each of the louvers includes a leading edge contact feature having a concave shape and a trailing edge contact feature having a corresponding convex shape that is configured to interface with the leading edge contact feature of a respective adjacent louver;
    wherein in the closed position, the first set of louvers forms a wall in a primary path of airflow; and wherein in the opened position, the first set of louvers are oriented in a direction of the primary path of the airflow.

9. The server rack of claim 8, wherein the server is connected to the plurality of rails at opposing sides of the server.

10. The server rack of claim 8, wherein the movable bulkhead further comprises a second set of louvers positioned adjacent to the first set of louvers.

11. The server rack of claim 8, wherein the server further comprises:
    a first end with a first aperture configured to allow the airflow into the server; and
    a second end with a second aperture configured to allow the airflow out of the server.

12. The server rack of claim 8, wherein the server is one of a plurality of servers connected to the plurality of rails.

13. The server rack of claim 8, wherein each of the louvers are oriented to extend along a direction between a first side of the chassis and a second side of the chassis that is opposite to the first side.

14. The server rack of claim 8, wherein each of the louvers are oriented to extend along a direction between the PCB and a cover of the chassis that is over the PCB.

15. The server rack of claim 8, wherein:
    when the movable bulkhead is in the closed position and at rest, the trailing edge contact feature of each louver is spaced apart from the leading edge contact feature of the respective adjacent louver; and
    when the movable bulkhead is in the closed position and is under a bending load, the movable bulkhead can flex such that the trailing edge contact feature of each louver contacts the leading edge contact feature of the respective adjacent louver.

16. The server rack of claim 8, wherein when the movable bulkhead is in the closed position and at rest, the trailing edge contact feature of each louver contacts the leading edge contact feature of the respective adjacent louver.

17. The server rack of claim 8, wherein the chassis further comprises a stationary bulkhead that extends across the server in the path of the airflow and includes an aperture for the airflow.

18. The server rack of claim 17, wherein the stationary bulkhead is adjacent and connected to the movable bulkhead.

* * * * *